United States Patent [19]

Rubin

[11] 4,089,705
[45] May 16, 1978

[54] HEXAGON SOLAR POWER PANEL

[75] Inventor: Irwin Rubin, Oxnard, Calif.

[73] Assignee: The United States of America as represented by the Administrator of the National Aeronautics and Space Administration, Washington, D.C.

[21] Appl. No.: 709,415

[22] Filed: Jul. 28, 1976

[51] Int. Cl.² .............................................. H01L 31/04
[52] U.S. Cl. .................................................. 136/89 P
[58] Field of Search ........................... 136/89 P, 89 PC

[56] References Cited

U.S. PATENT DOCUMENTS

| | | | |
|---|---|---|---|
| 3,094,439 | 6/1963 | Mann et al. | 136/89 |
| 3,369,939 | 2/1968 | Myer | 136/89 |
| 3,973,996 | 8/1976 | Kennedy | 136/89 X |
| 3,988,166 | 10/1976 | Beam | 136/89 |

Primary Examiner—John H. Mack
Assistant Examiner—Aaron Weisstuch
Attorney, Agent, or Firm—Robert F. Kempf; Paul F. McCaul; Robert Kinberg

[57] ABSTRACT

A solar energy panel comprises a support upon which silicon cells are arrayed. The cells are wafer thin and of two geometrical types, both of the same area and electrical rating, namely hexagon cells and hourglass cells. The hourglass cells are composites of half hexagons. A near perfect nesting relationship of the cells achieves a high density packing whereby optimum energy production per panel area is achieved.

5 Claims, 5 Drawing Figures

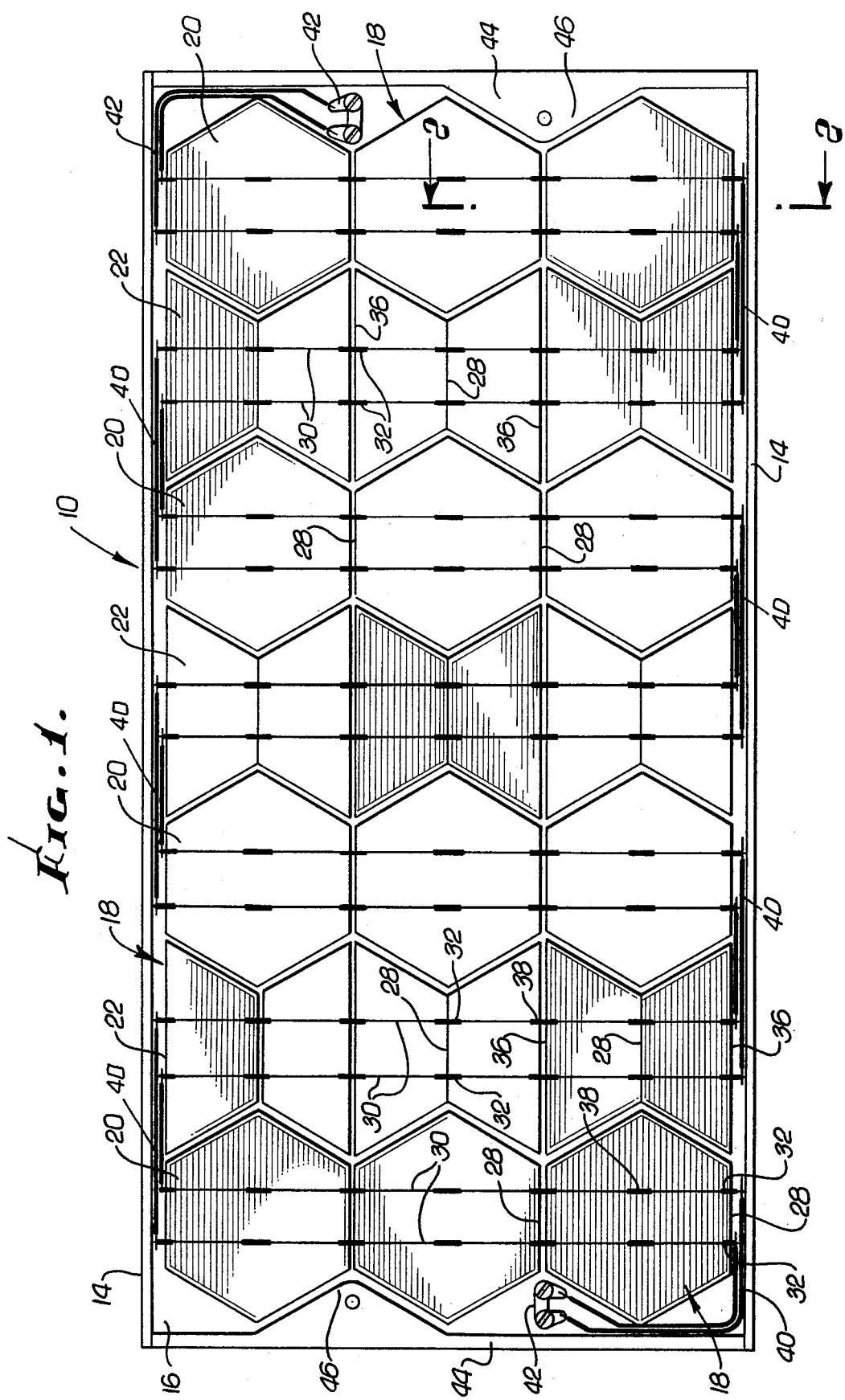

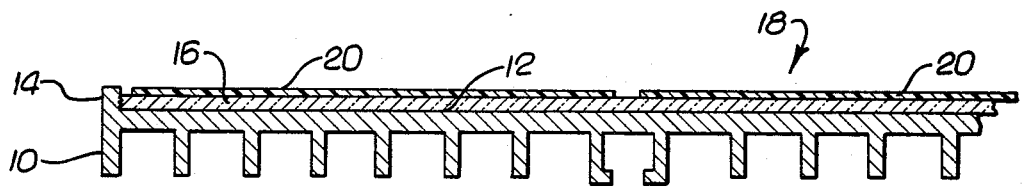
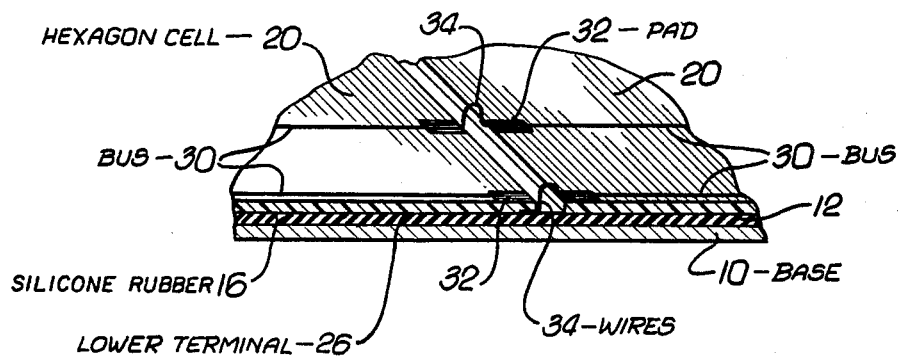
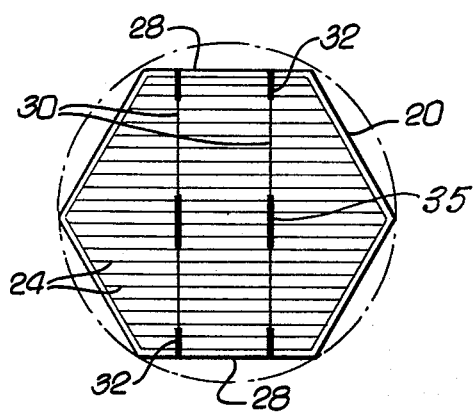
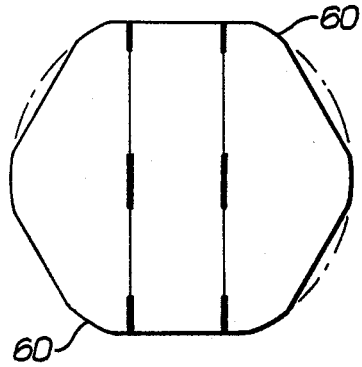

HEXAGON SOLAR POWER PANEL

ORIGIN OF INVENTION

The invention described herein was made in the performance of work under a NASA contract and is subject to the provisions of Section 305 of the National Aeronautics and Space Act of 1958, Public Law 85-568 [72 Stat. 435, 42 U.S.C. 2457].

FIELD OF INVENTION

This invention relates to solar power panels, and particularly to the efficient utilization of panel area for occupation by solar cells.

BACKGROUND OF THE INVENTION

A solar energy panel now typically comprises an aluminum extrusion frame supporting a plate upon which silicon cells are arrayed. Such cells are wafer thin and circular, having been made by cutting cylindrical ingots of silicon. The plate may be made of epoxy glass sheeting. In a well understood manner, the silicon wafers are doped with suitable "P" or "N" type material in order to impart the photoelectric generating properties. A grid of electrical collectors and electrical terminals are printed upon the wafer. Electrical connections are made for serial association of the cells. Finally, the wafers are encased in a proctective plastic window.

Individual cells 2.15 inches in diameter under nominally good conditions of solar intensity, produce perhaps about half an ampere at about 0.4 volt or about 0.2 watts. The cell itself thus produces about 55 watts per thousand square inches. But when the cells are placed in staggered or offset array on the panel, there remain unused areas not only at the boundaries, but also at the generally triangular spaces between the adjacent cells. Consequently the power production drops from an optimum of 55 watts per thousand square inches to about 35 watts per thousand square inches.

The primary object of this invention is to utilize panel area in a simple and effective manner, with consequent improvement in the cost of energy production.

SUMMARY OF THE INVENTION

In order to accomplish the foregoing objective, the circular silicon wafers are shaped into the form of a regular hexagon without material sacrifice of the silicon ingot material. A perfect or near perfect nesting relationship is achieved. Half hexagons and hourglass composites of half hexagons complete the high densisty packing.

BRIEF DESCRIPTION OF THE DRAWINGS

A detailed description of the invention will be made with reference to the accompanying drawings wherein like numerals designate corresponding parts in the several figures. These drawings, unless described as diagrammatic or unless otherwise indicated, are to scale.

FIG. 1 is a plan view of a solar panel incorporating the present invention.

FIG. 2 is an enlarged fragmentary transverse sectional view taken along a plane corresponding to line 2—2 of FIG. 1.

FIG. 3 is an enlarged view of a hexagon cell, showing its grid of electrical collectors.

FIG. 4 is a transverse sectional view showing the serial connection of adjacent cells.

FIG. 5 is a plan view of a modified solar cell.

DETAILED DESCRIPTION OF PREFERRED EMBODIMENT

The following detailed description is of the best presently contemplated mode of carrying out the invention. This description is not to be taken in a limiting sense, but is made merely for purposes of illustrating the general principles of the invention since the scope of the invention is best defined by the appended claims.

Structural and operational characteristics attributed to forms of the invention first described shall also be attributed to forms later described, unless such characteristics are obviously inapplicable or unless specific exception is made.

The solar panel illustrated in FIG. 1 is rectangular and designed to be mounted in side-by-side relationship to similar panels. The panel comprises an aluminum extrusion base 10 (FIG. 2) having a flat upper surface 12 bounded laterally by upstanding rims 14. A silicone rubber interface 16 fits on the top surface between the rims 14 and serves as an insulation support for individual solar cells 18 arrayed thereon.

The under surface of the base 10 has a plurality of ribs that serve as cooling fins. Some of the ribs are flanged for interlocking fasteners (not shown) whereby the panel is attached to a building or other structure.

The cells 18 as shown in FIG. 1 are of two types, hexagon cells 20 and hourglass cells 22. The hourglass cells are each formed as a composite of two halves of a hexagon cell. There are, in the present example, four longitudinally spaced transverse rows of three hexagons each. Between the spaced hexagon rows are hourglasses 22. The two cell shapes complement each other to provide a very close packing whereby nearly the entire surface of the panel comprises solar cells.

In a well understood manner, the individual cells generate electrical energy between terminals formed respectively on opposite sides of the cell. The terminal on the surface exposed to radiation is formed as a fine grid of conductors 24 (FIG. 3) silk screened thereon to extend in close parallel relationship whereby on optimum low resistance electron flow path is provided. The bottom terminal 26 (FIG. 4) need not serve as a window and hence is a solid thin disc.

A bus extends transversely of the grid of conductors 24 to opposite hexagon edges 28. For purposes of ensuring system integrity, two parallel circuits are formed through the top surface of each cell so that failure of one bus circuit (as at a solder connection or internal break) will not disable the system. For this purpose, the bus is formed as two spaced side-by-side elements 30 (FIG. 1). The ends of the bus elements 30 have enlarged pads 32 whereby wire connections can be soldered. Thus, as shown in FIG. 4, opposite junctions of adjacent cells are connected together by two expanded metal wires 34. Thus corresponding first ends of the wires 34 are soldered to the bottom terminal 26 on the under surface and corresponding second ends of the wires 34 are soldered respectively to the pads 32 on top surfaces. Preferably the wires are loose enough to provide strain relief.

The hourglass cells 22 are made simply by diametrically cutting the hexagon cells into two symmetrical halves, leaving three of the six hexagon edges intact and forming two new edges 36 (FIG. 1). The cell halves are transposed to place the newly formed edges 36 at the ends and to place the end hexagon edges 28 at the center. The half hexagon elements are electrically joined into a single hourglass cell of the same area as the hexagon cells. Hence, they have the same, and thus compatible, current characteristics. For this purpose, the halved bus elements 30 are soldered together across the now adjacent edges 28. A spot of solder may bridge the pads 32 on opposite sides. Similarly, the solder bridges the halved terminal on the underside.

New terminal pads 38 are formed at the edges 36 for connection to adjacent cells. For this purpose, the central portions 35 of the bus elements 30 as originally printed are appropriately formed to provide the pads. Three adjacent hourglass cells are serially connected together in the same manner as the hexagonal cells.

The rows of cells are serially connected together in serpentine fashion by wires 40. The end wires attach to terminals 42 (FIGS. 1 and 2) at both ends of the panel. The terminals are attached to the glass plate on top for connection of the wires. The terminals extend with suitable insulation through the base 10 for suitable connection to adjacent panels and to the line services by the panels.

The ends of the panels are closed by identical brackets 44 that fit between the rims 14. Each bracket 44 has a triangular projection 46 that nests between edges of two of the three adjacent cells. The end brackets 44 leave small triangular spaces between the edges of the other two of the three adjacent cells for the terminals 42.

The cells when properly connected are encapsulated in a window of suitable plastic material such as General Electric RTV 615. In addition to being translucent and electrically nonconductive, the material is moisture resistant and stable.

DESCRIPTION OF ALTERNATIVE EMBODIMENT

The hexagon cell shown in FIGS. 1 to 4 is made by cutting six contiguous segments from a silicon ingot whereby a perfect hexagon results. The cell shown in FIG. 5 salvages some of the silicon ingot material and yet in very large measure still achieves greater area utilization. For this purpose, six noncontiguous segments are cut so that the resulting cell is an imperfect hexagon with rounded corners 60. When these cells fit together, a very small unoccupied surface results.

Intending to claim all novel, useful and unobvious features shown or described, I make the following claims:

1. In a solar power panel:
   (a) a support providing a surface for an array of solar cells;
   (b) a plurality of solar cells mounted on said surface and arranged in side-by-side rows;
   (c) first alternate rows of solar cells comprising a number of correspondingly oriented cells of substantially hexagonal configuration with sides of adjacent cells being adjoining;
   (d) second alternate rows of solar cells comprising a number of cells of substantially hourglass configuration complementing the substantially hexagonal configuration of the cells of said first alternate rows;
   (e) terminal means mounted on said support;
   (f) means electrically connecting said cells to each other and to said terminal means; and
   (g) window means cooperable with said support for enclosing said cells;
   (h) substantially all of said first and second alternate rows of solar cells terminating at opposite ends respectively along two common, substantially parallel spaced lines, thereby to more fully utilize the available panel support area.

2. The combination as set forth in claim 1 in which the cells are all of the same area for electrical compatibility.

3. The combination as set forth in claim 1 in which said cells of said second alternate rows are each made as composite half hexagons with halves transposed and opposite hexagon edges abutted.

4. The combination as set forth in claim 1 in which each hexagon cell has on one surface to be exposed to radiation, an array of fine conductors for collecting generated current, and on its other surface, a substantially solid terminal, each hexagon cell having a bus element extending across the array of conductors and from one hexagon edge to the other, there being solder pad areas at the ends of the bus element as well as at the middle; each hourglass cell comprising a composite of transposed halves of the hexagon cells, the middle pad area being bisected when the hexagon cell is halved to form terminals at opposite hourglass edges, the halves being electrically connected in parallel at the center so that the hourglass cells are of the same operative area as the hexagon cells.

5. The combination as set forth in claim 1 in which each hexagon cell has rounded corners resulting from the trimming of a circular blank to near hexagon shape by cutting non-contiguous segments from the circular blank.

* * * * *